United States Patent
Wan et al.

(10) Patent No.: US 9,748,072 B2
(45) Date of Patent: Aug. 29, 2017

(54) LOWER DOSE RATE ION IMPLANTATION USING A WIDER ION BEAM

(71) Applicant: Advanced Ion Beam Technology, Inc., Hsin-Chu (TW)

(72) Inventors: Zhimin Wan, Sunnyvale, CA (US); Rekha Padmanabhan, San Jose, CA (US); Xiao Bai, Fremont, CA (US); Gary N. Cai, Fremont, CA (US); Ching-I Li, Tainan (TW); Ger-Pin Lin, Tainan (TW); Shao-Yu Hu, Tainan (TW); David Hoglund, Danvers, MA (US); Robert E. Kaim, Danvers, MA (US); Kourosh Saadatmand, Danvers, MA (US)

(73) Assignee: ADVANCED ION BEAM TECHNOLOGY, INC., Hsin-Chu (TW)

( * ) Notice: Subject to any disclaimer, the term of this patent is extended or adjusted under 35 U.S.C. 154(b) by 232 days.

(21) Appl. No.: 14/312,617

(22) Filed: Jun. 23, 2014

(65) Prior Publication Data

US 2015/0371857 A1 Dec. 24, 2015

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/024* (2013.01); *H01J 2237/0835* (2013.01); *H01J 2237/303* (2013.01); *H01J 2237/30477* (2013.01)

(58) Field of Classification Search
CPC ...... H01J 37/08; H01J 37/3171; H01J 27/024; H01J 2237/31701; H01J 2237/0458; H01J 2237/065; H01J 2237/0835
See application file for complete search history.

(56) References Cited

U.S. PATENT DOCUMENTS

| | | | |
|---|---|---|---|
| 6,403,452 B1 | 6/2002 | Murakoshi et al. | |
| 7,704,674 B1 * | 4/2010 | Amblard | G03F 7/11 430/270.1 |
| 7,902,527 B2 | 3/2011 | Chen et al. | |
| 2006/0113493 A1 * | 6/2006 | Kabasawa | H01J 27/024 250/492.21 |
| 2009/0236547 A1 * | 9/2009 | Huang | H01J 37/20 250/492.21 |

(Continued)

*Primary Examiner* — Brooke Purinton
(74) *Attorney, Agent, or Firm* — Morrison & Foerster LLP (57) ABSTRACT

In an exemplary process for lower dose rate ion implantation of a work piece, an ion beam may be generated using an ion source and an extraction manipulator. The extraction manipulator may be positioned at a gap distance from an exit aperture of the ion source. A current of the ion beam exiting the extraction manipulator may be maximized when the extraction manipulator is positioned at an optimal gap distance from the exit aperture. The gap distance at which the extraction manipulator is positioned from the exit aperture may differ from the optimal gap distance by at least 10 percent. A first potential may be applied to a first set of electrodes. An x-dimension of the ion beam may increase as the ion beam passes through the first set of electrodes. The work piece may be positioned in the ion beam to implant ions into the work piece.

37 Claims, 6 Drawing Sheets

(56) References Cited

U.S. PATENT DOCUMENTS

| | | | | |
|---|---|---|---|---|
| 2010/0116983 A1* | 5/2010 | Benveniste | ............. | H01J 37/05 |
| | | | | 250/298 |
| 2012/0097861 A1* | 4/2012 | White | ....................... | H01J 3/04 |
| | | | | 250/397 |
| 2014/0134833 A1* | 5/2014 | Tsukihara | ............. | H01J 37/302 |
| | | | | 438/514 |
| 2014/0326901 A1* | 11/2014 | Colvin | ................ | H01J 37/3171 |
| | | | | 250/492.21 |

* cited by examiner

Beam Profile
400

FIG. 4

Beam Profile
500

LOWER DOSE RATE ION IMPLANTATION USING A WIDER ION BEAM

BACKGROUND

1. Field

The present disclosure relates generally to ion implantation and, more specifically, to lower dose rate ion implantation using a wider ion beam.

2. Related Art

Ion implantation is a process used in fabricating integrated semiconductor devices whereby impurities are introduced into a work piece. During ion implantation, an ion beam may be extracted from an ion source and filtered by mass, charge, and energy through a magnetic analyzer before being directed to the work piece. In conventional ion implantation processes, the ion beam may typically be optimized to maximize the beam density, thereby maximizing dose rates and enabling higher throughput. For example, the ion beam may be extracted from the ion source under conditions that maximize the ion beam current. Further, the ion beam may be shaped and focused to form a narrow concentrated ribbon-shaped beam having high beam density.

As semiconductor manufacturers continue to shrink the dimensions of semiconductor devices, the current generation of semiconductor devices may be increasingly sensitive to ion implantation at high dose rates. In particular, ion implantation at high dose rates may cause significant device damage and yield loss. One method of reducing the dose rates may be to increase the scan speed of the work piece relative to the ion beam. However, adjusting the scan speed alone may not be sufficient to reduce device damage to an acceptable level.

BRIEF SUMMARY

Systems and processes for implanting ions into a work piece at lower dose rates using a wider ion beam are provided. In one exemplary embodiment, an ion beam may be generated using an ion source and an extraction manipulator. The ion beam may include an x-dimension that is perpendicular to a y-dimension of the ion beam. Further, the x-dimension and the y-dimension may be perpendicular to a direction of travel of the ion beam. The extraction manipulator may be positioned at a gap distance from an exit aperture of the ion source. A current of the ion beam exiting the extraction manipulator may be maximized when the extraction manipulator is positioned at an optimal gap distance from the exit aperture. The gap distance at which the extraction manipulator is positioned from the exit aperture may differ from the optimal gap distance by at least 10 percent. A first potential may be applied to a first set of electrodes. The x-dimension of the ion beam may increase as the ion beam passes through the first set of electrodes. The work piece may be positioned in the ion beam to implant ions into the work piece.

DETAILED DESCRIPTION

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

The present disclosure relates to systems and processes for lower dose rate ion implantation using a wider ion beam. In one example process, an ion beam may be generated using an ion source and an extraction manipulator. The extraction manipulator may be positioned from an exit aperture of the ion source at a gap distance that differs from an optimal gap distance by at least 10 percent. When the extraction manipulator is positioned at the optimal gap distance from the exit aperture, the current of the ion beam exiting the extraction manipulator may be maximized. Positioning the extraction manipulator at a gap distance that is significantly different from the optimal gap distance may have unexpected advantages or results. For example, a wider ion beam may be generated when the extraction manipulator is positioned at a gap distance that is different from the optimal gap distance compared to when the extraction manipulator is positioned at the optimal gap distance. A wider ion beam may be desirable for reducing the beam density of the ion beam, thereby lowering dose rates and reducing device damage during ion implantation.

In this example, the process may further include applying a first potential to a first set of electrodes, applying a second potential to a second set of electrodes, and applying a magnetic field to the ion beam using multipole magnets. The width of the ion beam may increase as the ion beam passes through the first set of electrodes and the uniformity along the height of the ion beam may improve as the ion beam passes through the second set of electrodes. In addition, the applied magnetic field may further increase the width of the ion beam. A work piece may be positioned in the ion beam to implant ions into the work piece. The cross-section of the ion beam at the work piece may have a width that is at least 80 mm and a height that is at least 300 mm. In the present disclosure, the width of the ion beam may be referred to as the x-dimension while the height of the beam may be referred to as the y-dimension.

1. Ion Implantation System

Figure 1A:
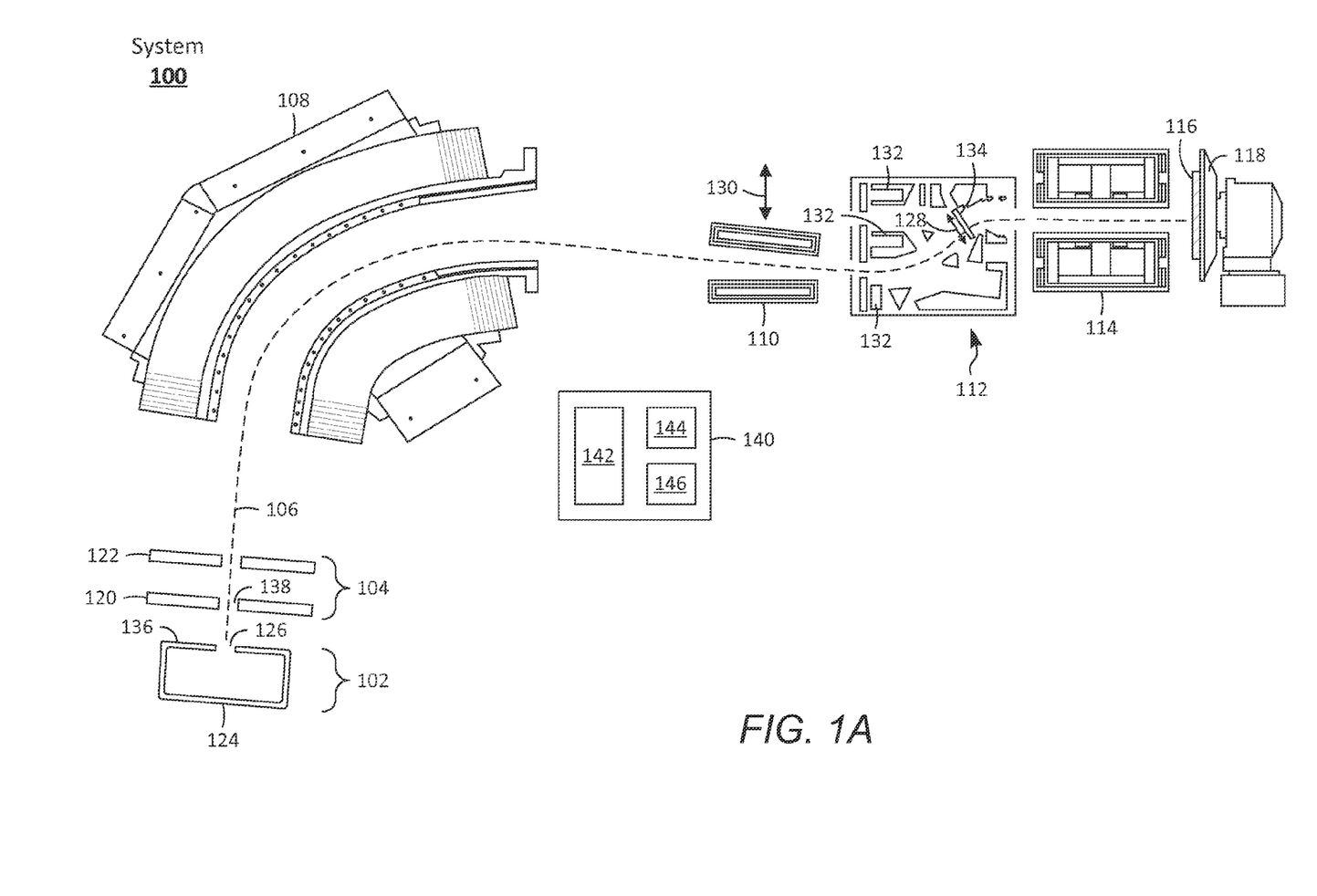
FIGS. 1A-B illustrate cross-sectional views of an exemplary ion implantation system.
Figure 1B:
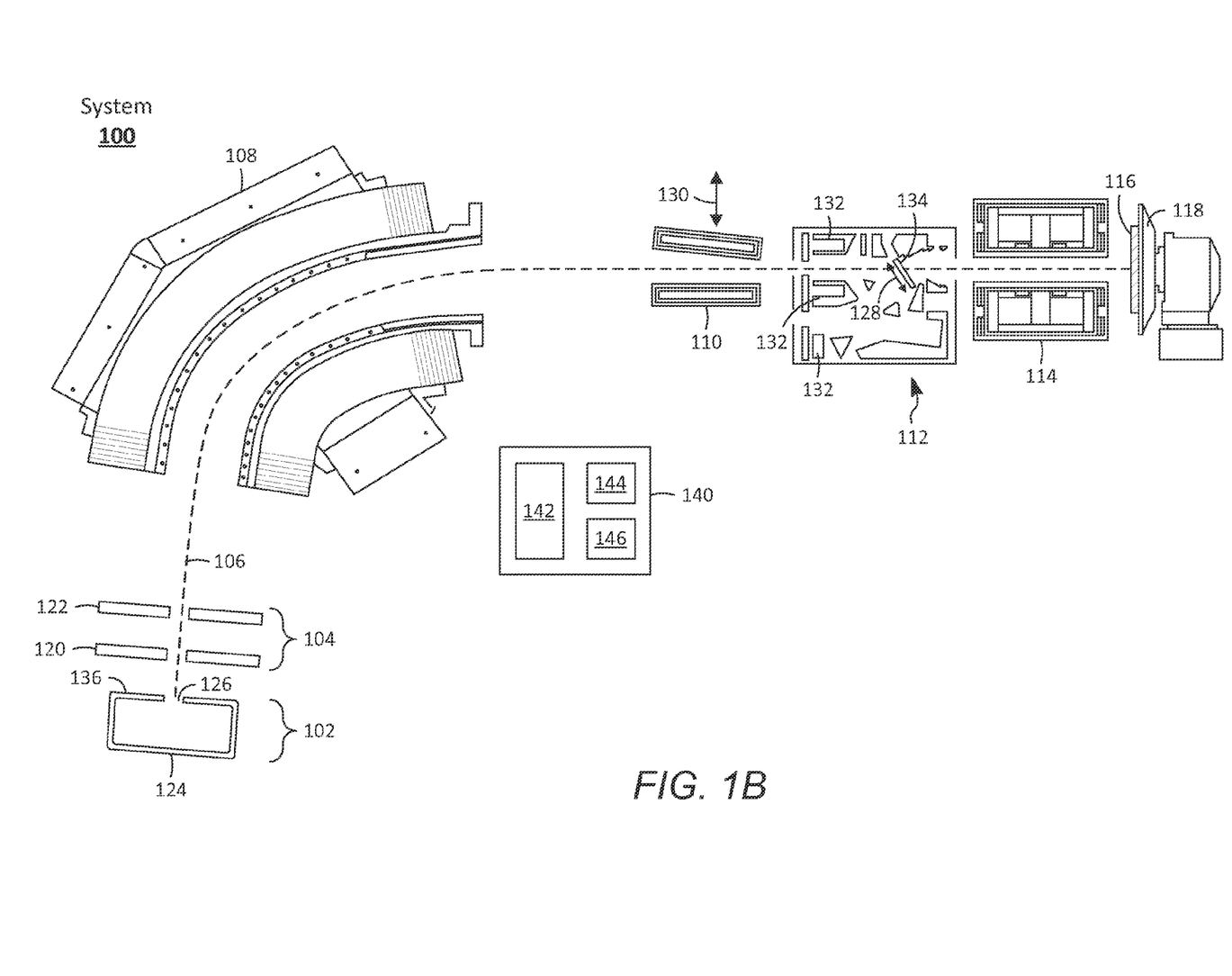

FIGS. 1A-B illustrate cross-sectional views of exemplary ion implantation system 100. System 100 may be used to perform lower dose ion implantation using a wider ion beam. For example, system 100 may be used to perform process 300 described below.

As shown in FIGS. 1A-B, system 100 may include ion source 102 and extraction manipulator 104 for generating ion beam 106. Extraction manipulator 104 may extract ion beam 106 from ion source 102 and direct ion beam 106 into mass analyzer 108 where ion beam 106 may be filtered by mass, charge, and energy. Ion beam 106 may be further directed through multipole magnets 110 and electrode assembly 112 and multipole magnets 114 to adjust the energy, shape, direction, angle, and uniformity of ion beam 106. In particular, electrode assembly 112 may function to adjust the energy of ion beam 106, remove neutral species from ion beam 106, and alter the size, shape, and uniformity of ion beam 106. Multipole magnets 110 and 114 may function to adjust the uniformity, center angle, and divergence angle of ion beam 106. System 100 may further include work piece support structure 118, which may be configured to position work piece 116 in the path of ion beam 106, thereby causing implantation of ions into work piece 116.

Ion source 102 may be configured to generate ions of a desired species. For example, for semiconductor device fabrication, desired ion species may include boron, phosphorus, or arsenic (e.g., B+, P+, and As+). In some examples, ion source 102 may comprise a Bernas source, a Freeman source, or an indirectly heated cathode source. Ion source 102 may include arc chamber 124 that may be configured to receive one or more process gases from one or more gas sources (not shown). Ion source 102 may be configured to form a plasma in arc chamber 124 by electron ionization of the one or more process gases. In this example, ion source 102 may include a cathode (not shown) disposed within arc chamber 124. The cathode may include a filament that may be heated to generate electrons for ionizing the one or more process gases. The cathode may be coupled to a power source (not shown), which may bias the cathode at an arc voltage to accelerate the electrons from the cathode to the sidewalls of arc chamber 124. The energized electrons may ionize the one or more process gases in arc chamber 124, thereby forming a plasma in arc chamber 124.

Ion source 102 may include faceplate 136 on one side of arc chamber 124. Faceplate 136 may include exit aperture 126 through which ions extracted from ion source 102 may exit arc chamber 124. In this example, exit aperture 126 may be a slit or a slot for forming a ribbon-shaped ion beam 106. In other examples, exit aperture may be a hole or a set of holes. Faceplate 136 may be coupled to a power source (not shown) to bias faceplate 136, thereby creating a potential difference (e.g., extraction voltage) between ion source 102 and extraction manipulator 104 to generate ion beam 106.

Extraction manipulator 104 may include suppression electrode 120 and ground electrode 122. A power supply (not shown) may be coupled to suppression electrode 120 to apply a suppression voltage to suppression electrode 120. Ground electrode 122 may be coupled to a ground potential. It should be recognized that in other examples, extraction manipulator 104 may include additional electrodes that may be biased using one or more power supplies.

Figure 2A:
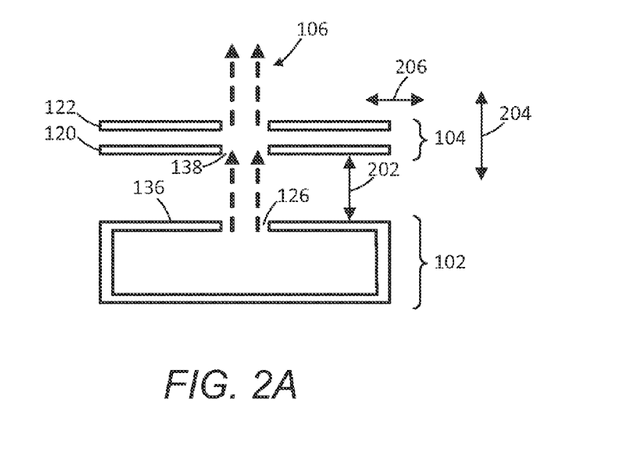
FIGS. 2A-C illustrate cross-sectional views of an exemplary ion source and extraction manipulator of an ion implantation system.
Figure 2B:
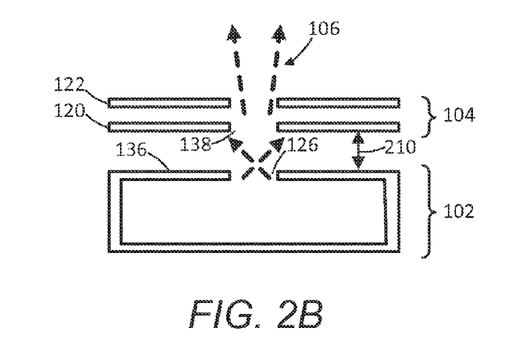
Figure 2C:
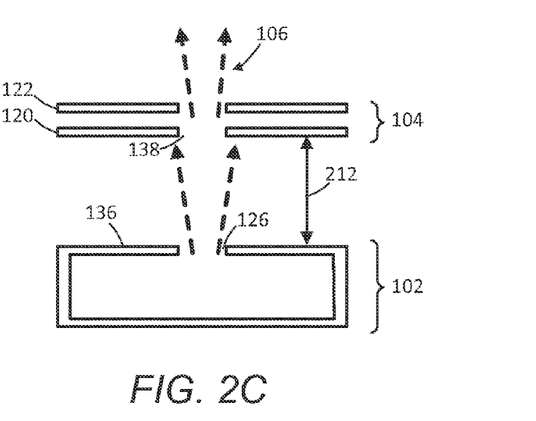

FIGS. 2A-C illustrate cross-sectional views of ion source 102 and extraction manipulator 104 of system 100. As shown in FIG. 2A, extraction manipulator 104 may be positioned at gap distance 202 from ion source 102. Gap distance 202 may refer to the distance between exit aperture 126 of ion source 102 and extraction manipulator 104. In this example, gap distance 202 may be the distance between exit aperture 126 and suppression electrode 120. It should be recognized that in other examples, the gap distance may refer more generally to the distance between the faceplate of the ion source and an electrode of the extraction manipulator that is closest to the ion source.

Extraction manipulator 104 may be configured to move relative to ion source 102. For example, extraction manipulator 104 may be configured to move in a direction indicated by arrows 204 to increase or decrease gap distance 202. Further, extraction manipulator 104 may be configured to move in a direction indicated by arrows 206 to align or misalign aperture 138 of suppression electrode 120 with respect to exit aperture 126. Arrows 204 may be perpendicular to arrows 206. In some examples, extraction manipulator 104 may be further configured to move in a direction orthogonal to the plane of the drawing in FIG. 2A.

In this example, extraction manipulator 104 may be configured such that suppression electrode 120 does not move with respect to ground electrode 122 as extraction manipulator 104 moves with respect to ion source 102. Thus, the distance between suppression electrode 120 and ground electrode 122 may be constant as extraction manipulator 104 moves with respect to ion source 102. However, it should be recognized that in other examples, extraction manipulator 104 may be configured such that only one or more electrodes of extraction manipulator 104 may move when adjusting gap distance 202 and that the distance between the electrodes of extraction manipulator 104 may change as extraction manipulator 104 is moved with respect to ion source 102.

With reference back to FIGS. 1A-B, ion beam 106 may include an x-dimension and a y-dimension. The x-dimension may be perpendicular to the y-dimension and both the x-dimension and the y-dimension may be perpendicular to the direction of travel of ion beam 106. In some examples, the x-dimension may be smaller than the y-dimension. In FIGS. 1A-B, the x-dimension of ion beam 106 may be parallel to the plane of the drawing while the y-dimension of ion beam 106 may be orthogonal to the plane of the drawing.

Mass analyzer 108 may be configured to generate a magnetic field such that only the ions in ion beam 106 having a desired energy and mass-to-charge ratio may pass through mass analyzer 108 toward work piece 116. Mass analyzer 108 may be configured to direct ion beam 106 along one of two paths. As shown in FIG. 1A, mass analyzer 108 may direct ion beam 106 along a first path that travels through a deceleration chicane (e.g., s-bend) path of electrode assembly 112. Alternatively, as shown in FIG. 1B, mass analyzer 108 may direct ion beam 106 along a second path that travels through a substantially straight drift/acceleration path of electrode assembly 112.

Multipole magnets 110 may include an array of coils arranged on ferromagnetic supports. Electrical energy may be supplied to the array of coils to generate a contiguous magnetic field. In particular, multipole magnets 110 may be configured such that electrical energy may be independently supplied to the individual coils such that the magnetic field gradient over the contiguous magnetic field may be adjusted. In this way, a suitable non-uniform magnetic field may be generated to adjust the size, shape, angle, and/or uniformity of ion beam 106. For example, a suitable magnetic field may be generated by multipole magnets 110 to control the size and current density of the ion beam. In doing so, multipole magnets 110 may be configured to adjust the shape of the beam as well as the spatial uniformity. Further, in some examples, multipole magnets 110 may be configured to generate a quadrupole magnetic field that may be suitable for adjusting the convergence or divergence angle of ion beam 106. It should be recognized that other variations of multipole magnets 110 are also possible. Additional examples of multipole magnets are described in U.S. Pat. No. 7,902,527 B2, which is incorporated herein by reference in its entirety.

In some examples, multipole magnets 110 may be configured to move along a track in a direction indicated by arrows 130. In this way, multipole magnets 110 may be positioned to receive ion beam 106 from mass analyzer 108 along one of two paths. For example, as shown in FIG. 1A, multipole magnets 110 may be positioned in front of a first entrance aperture of electrode assembly 112 when ion beam 106 is directed along the first path. Alternatively, as shown in FIG. 1B, multipole magnets 110 may be positioned in front of a second entrance aperture of electrode assembly 112 when ion beam 106 is directed along the second path.

Electrode assembly 112 may comprise multiple sets of electrodes that are configured to adjust the energy of ion beam 106 and/or remove neutral species from ion beam 106. As shown in FIGS. 1A-B, electrode assembly 112 may include two paths for ion beam 106. FIG. 1A shows ion beam 106 traveling through the deceleration chicane (e.g., s-bend) path of electrode assembly 112 while FIG. 1B shows ion beam 106 traveling through the substantially straight drift/acceleration path of electrode assembly 112. Examples of similar electrode assemblies are described in U.S. Pat. No. 7,902,527 B2 and U.S. Patent Application Publication No. 2012/0097861, each of which is incorporated herein by reference in its entirety.

Electrode assembly 112 may include first set of electrodes 132 for adjusting the x-dimension of ion beam 106. In some examples, first set of electrodes 132 may include multiple electrodes that are positioned to allow the ion beam to pass in between the electrodes. However, in other examples, first set of electrodes may be a single electrode having one or more channels for the ion beam to pass through. In the present example, first set of electrodes may be a single electrode having two channels for ion beam 106 to pass through. Further, first set of electrodes 132 may be positioned such that the length of first set of electrodes 132 is aligned with a plane that is approximately parallel to the y-dimension of ion beam 106 as ion beam 106 passes through first set of electrodes 132. In other examples, first set of electrodes 132 may be positioned such that the length of first set of electrodes 132 is approximately parallel to the y-dimension of ion beam 106 as ion beam 106 passes through first set of electrodes 132. In this example, the length of first set of electrodes 132 may be orthogonal to the plane of the drawing in FIGS. 1A-B. In examples where first set of electrodes includes multiple electrodes, each electrode of first set of electrodes 132 may be parallel to the length of first set of electrodes 132. First set of electrodes 132 may be coupled to a power supply (not shown). The power supply may be configured to bias first set of electrodes 132 at a desired potential. In some examples, the power supply may be configured to bias all the electrodes of first set of electrodes 132 at the same desired potential. In one such example, the electrodes of first set of electrodes 132 may be electrically coupled together. In other examples, the power supply may be configured to bias each electrode of first set of electrodes 132 independently. In some examples, first set of electrodes 132 may further function as suppression electrodes to suppress electrons in ion beam 106 from entering electrode assembly 112.

Electrode assembly 112 may further include second set of electrodes 134 for adjusting the shape and uniformity of ion beam 106 with respect to the y-dimension. In some examples, second set of electrodes 134 may include at least two electrodes that are positioned to allow the ion beam to pass in between the electrodes. In other examples, second set of electrodes 134 may be a single electrode having one or more channels for the ion beam to pass through. In the present example, second set of electrodes 134 may be positioned such that length 128 of second set of electrodes 134 is aligned with a plane that is approximately parallel to the x-dimension of the ion beam as the ion beam passes through second set of electrodes 134. In other examples, second set of electrodes 134 may be positioned such that length 128 of second set of electrodes 134 is approximately parallel to the x-dimension of ion beam 106 as ion beam 106 passes through second set of electrodes 134. In examples where second set of electrodes 134 includes at least two electrodes, each electrode may be parallel to length 128 of second set of electrodes 134.

Second set of electrodes 134 may be coupled to a power supply (not shown). The power supply may be configured to bias all the electrodes of second set of electrodes 134 at the same desired potential. In one such example, the electrodes of second set of electrodes 134 may be electrically coupled together. In some examples, the power supply may be configured to bias second set of electrodes 134 at the same potential. In other examples, the power supply may be configured to bias each electrode of second set of electrodes 134 independently. In some examples, second set of electrodes 134 may further function to adjust the y-dimension of ion beam 106. In U.S. Patent Application Publication No. 2012/0097861, electrodes 614a and 614b of FIG. 8 may be an example of the second set of electrodes.

Multipole magnets 114 may have a similar construction as multipole magnets 110 described above. In some examples, multipole magnets 114 may include fewer or additional coils compared to multipole magnets 110. In some examples, multipole magnets 114 may function to adjust the shape, direction, focus, and/or uniformity of ion beam 106. In addition, multipole magnets 114 may be configured to steer ion beam 106 to strike the surface of work piece 116 in a particular location, or to allow for other positional adjustments of ion beam 106. In other examples, multipole magnets 114 may be configured to repeatedly deflect ion beam 106 to scan work piece 116, which may be stationary or moving.

Work piece support structure 118 may be configured to position work piece 116 in front of ion beam 106, thereby causing ions to implant into work piece 116. In some examples, work piece support structure 118 may be configured to translate in one or more directions. For example, work piece support structure 118 may be configured to move work piece 116 with respect to ion beam 116 to scan ion beam 106 across work piece 116. More specifically, work piece support structure 118 may be configured to move work piece 116 in a direction parallel to the x-dimension of ion beam 106. Further, work piece support structure 118 may be configured to rotate work piece 116.

In some examples, work piece support structure 118 may be configured to control the temperature of work piece 116. For example, the temperature of work piece 116 may be controlled by flowing heated or cooled gas onto the backside of work piece 116. In some examples, work piece support structure 118 may be configured to establish good thermal contact with work piece 116. In these examples, the temperature of work piece 116 may be controlled by controlling the temperature of work piece support structure 118. In some examples, work piece support structure 118 may be configured to be heated or cooled using fluid from a fluid heat exchanger. The temperature of work piece support structure 118 may thus be controlled by flowing heated or cooled fluid from the fluid heat exchanger. In other examples, work piece support structure 118 may include heating and cooling elements (e.g., thermoelectric elements, resistive heating elements, etc.) for controlling the temperature of work piece support structure 118.

Work piece 116 may comprise any suitable substrate used in the manufacturing of semiconductor devices, solar panels, or flat-panel displays. In examples where work piece 116 comprises a semiconductor substrate (e.g., silicon, germanium, gallium arsenide, etc.), work piece 116 may include semiconductor devices at least partially formed thereon.

It should be appreciated that suitable variations and modifications may be made to system 100. For instance, system 100 may include additional components such as additional electrodes and magnets for manipulating ion beam 106. Further, the position of first set of electrodes 132, second set of electrodes 134, and multipole magnets 110, 114 may vary. In some examples, multipole magnets 114 may be disposed between multipole magnets 110 and electrode assembly 112. In other examples, first set of electrodes 132 and/or second set of electrodes 134 may be discrete components or part of a different assembly of system 100.

System 100 may further include controller 140 that is coupled to various components of system 100 to control the operation thereof. Controller 140 may include processor 142, memory 144, and support circuits 146. Processor 142 may be one of any form of general-purpose computer processor. Memory, or computer-readable medium, 144 may include one or more of readily available memory such as random access memory (RAM), read-only memory (ROM), floppy disk, hard disk, optical storage media (e.g., compact disc or digital video disc), flash drive, or any other form of digital storage, local or remote. Support circuits 146 may include cache, power supplies, clock circuits, input/output circuitry and subsystems, and the like. In some examples, a non-transitory computer-readable storage medium of memory 144 may be used to store instructions for performing lower dose rate ion implantation using a wider ion beam (e.g., process 300, described below). The instructions may be executed or invoked (e.g., by processor 142) to control the operation of system 100 in the manner described herein.

2. Lower Dose Rate Ion Implantation Process Using a Wider Ion Beam

Figure 3:
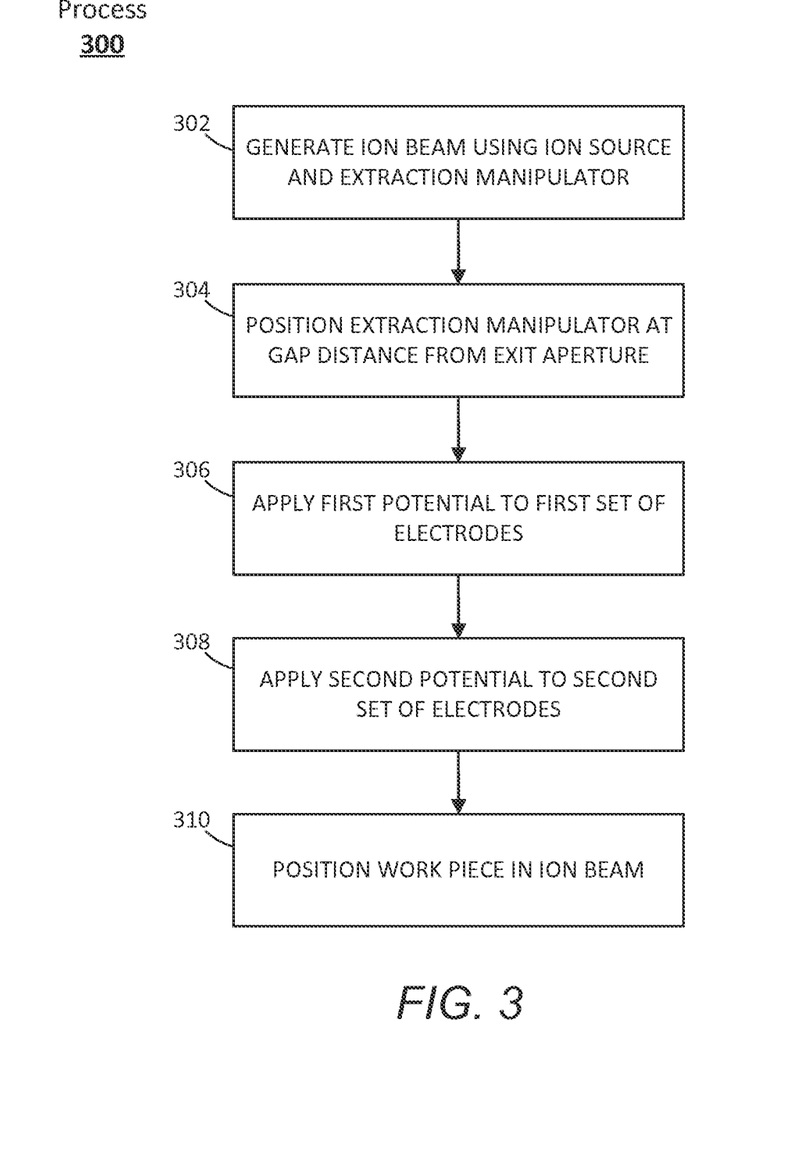
FIG. 3 illustrates an exemplary process for lower dose ion implantation using a wider ion beam.

FIG. 3 illustrates exemplary process 300 for lower dose rate ion implantation using a wider ion beam. Process 300 may be performed using any suitable ion implantation system. For example, process 300 may be performed using ion implantation system 100 described above with reference to FIG. 1. In this example, process 300 may be described with simultaneous reference to FIGS. 1 and 3.

Figure 6:
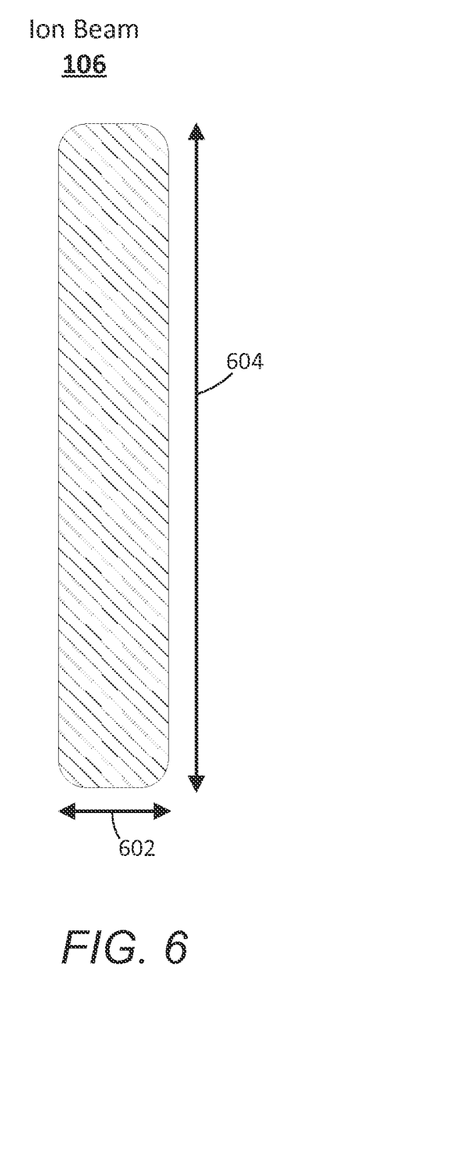
FIG. 6 illustrates a cross-sectional view of an exemplary ion beam that may be used in lower dose rate ion implantation processes.

At block 302 of process 300, ion beam 106 may be generated using ion source 102 and extraction manipulator 104. Ion beam 106 may be generated having an elongated ribbon-shaped cross-section. For example, FIG. 6 illustrates an exemplary cross-sectional view of ion beam 106 at work piece 116. In this example, the direction of travel of ion beam 106 may be perpendicular to the plane of the drawing in FIG. 6. As shown, ion beam 106 may include an x-dimension 602 and a y-dimension 604. X-dimension 602 may be perpendicular to y-dimension 604 and both x-dimension 602 and y-dimension 604 may be perpendicular to the direction of travel of ion beam 106. Further, y-dimension 604 may be significantly greater than x-dimension 602. In some examples, the ratio of y-dimension 604 to x-dimension 602 of ion beam 106 at work piece 116 may be at least 3:1.

With reference back to FIG. 1, generating ion beam 106 using ion source 102 and extraction manipulator 104 may include forming a plasma from one or more process gases in arc chamber 124 to generate the desired ion species. Suitable voltages may then be applied to faceplate 136, suppression electrode 120, and ground electrode 122 to extract ion beam 106 from ion source 102 at the desired energy level. For example, to generate ion beam 106 comprising positive ions, a positive potential relative to ground may be applied to faceplate 136. In addition, a negative potential relative to ground may be applied to suppression electrode 120 to prevent electrons in ion beam 106 downstream of extraction manipulator 104 from being drawn into ion source 102.

Generating ion beam 106 using ion source 102 and extraction manipulator 104 at block 302 may further include positioning extraction manipulator 104 at the optimal gap distance from exit aperture 126. For example, with reference to FIG. 2A, the optimal gap distance may refer to gap distance 202 between extraction manipulator 104 and exit aperture 126 at which the current of ion beam 106 exiting extraction manipulator 104 is maximized for a given set of ion source conditions. Ion source conditions may include the flow rate of one or more process gases into arc chamber 124, the cathode voltage, the arc current, and the bias potential of faceplate 136. Further, in some examples, the suppression current of suppression electrode 120 may be minimized for the given set of ion source conditions when extraction manipulator 104 is positioned at the optimal gap distance from exit aperture 126. The suppression current may refer to the current at suppression electrode 120 that is generated by ions from ion source 102 colliding into suppression electrode 120. In some examples, the optimal gap distance of extraction manipulator 104 from exit aperture 126 may be determined by iteratively adjusting (e.g., "tuning") the gap distance to maximize the current of ion beam 106 exiting extraction manipulator 104 and minimize the suppression current.

In conventional ion implantation processes, ion implantation may be performed with extraction manipulator 104 positioned at the optimal gap distance. This may be desirable because the current of ion beam 106 exiting extraction manipulator 104 is maximized, thereby maximizing beam density and dose rate. In addition, the suppression current may be minimized at the optimal gap distance and thus ion bombardment on suppression electrode 120 may be minimized. This may reduce the buildup of undesirable deposits on extraction manipulator 104, which may improve particle performance and system reliability. Minimizing ion bombardment on suppression electrode 120 may also increase the life of suppression electrode 120, thereby reducing operating costs. Further, when extraction manipulator 104 is positioned at the optimal gap distance, the uniformity of ion beam 106 may be readily optimized, thereby facilitating the uniform implanting of ions into work piece 116.

At block 304 of process 300, extraction manipulator 104 may be positioned at a gap distance from exit aperture 126 of ion source 102 that is different from the optimal gap distance. For example, block 304 may include adjusting (e.g., "de-tuning") the gap distance between extraction manipulator 104 and exit aperture 126 such that the current of ion beam 106 exiting extraction manipulator 104 is not maximized for a given set of ion source conditions. When extraction manipulator 104 is positioned at a gap distance that differs from the optimal gap distance, ion beam 106 can be considered to be in an "unmatched condition." In some examples, extraction manipulator 104 may be positioned at a gap distance different from the optimal gap distance after positioning extraction manipulator 104 at the optimal gap distance in block 302. However, in other examples, extraction manipulator 104 may be positioned at a gap distance different from the optimal gap distance without initially positioning extraction manipulator 104 at the optimal gap distance in block 302.

It should be recognized that in some examples, positioning extraction manipulator 104 may include moving the entire extraction manipulator 104. However, in other examples, positioning extraction manipulator 104 may include moving one or more electrodes of extraction manipulator 104 relative to exit aperture 126. In one such example, positioning extraction manipulator 104 may comprise positioning suppression electrode 120 such that the gap distance between suppression electrode 120 and exit aperture 126 is different from the optimal gap distance.

FIGS. 2B and 2C illustrate extraction manipulator 104 positioned at gap distances 210, 212, respectively, from exit aperture 126. Gap distances 210, 212 are different from the optimal gap distance. In particular, gap distance 210 shown in FIG. 2B may be less than the optimal gap distance while gap distance 212 shown in FIG. 2C may be greater than the optimal gap distance. In some examples, the suppression current may be lower when extraction manipulator 104 is positioned at gap distance 212 that is greater than the optimal gap distance than at gap distance 210 that is less than the optimal gap distance. This may be because the rate at which ions from ion source 102 collide into suppression electrode 120 increases when suppression electrode 120 is positioned closer to exit aperture 126. Therefore, in these examples, extraction manipulator 104 may be positioned at gap distance 212 that is greater than the optimal gap distance. However, in other examples, the profile of ion beam 106 may become significantly non-uniform and asymmetrical when extraction manipulator 104 is positioned at gap distance 212 that is greater than the optimal gap distance. In these examples, extraction manipulator 104 may be positioned at gap distance 210 that is less than the optimal gap distance.

In some examples, extraction manipulator 104 may be positioned such that the gap distance differs from the optimal gap distance by at least 10 percent. In other examples, extraction manipulator 104 may be positioned such that the gap distance differs from the optimal gap distance by at least 20 percent. In yet other examples, extraction manipulator 104 may be positioned such that the gap distance differs from the optimal gap distance by at least 30 percent. In yet other examples, extraction manipulator 104 may be positioned such that the gap distance differs from the optimal gap distance by at least 40 percent. However, in some examples, deviating too far from the optimal gap distance may result in ion beam 106 having an undesirable non-symmetric profile. Further, the suppression current may become excessive when the gap distance deviates too far from the optimal gap distance. This may cause excessive buildup of deposits on extraction manipulator 104 and arcing in extraction manipulator 104. In these examples, extraction manipulator 104 may be positioned such that the gap distance is different from the optimal gap distance, but also such that the suppression current is less than 8 mA, or in some cases, less than 2 mA. In a specific example, extraction manipulator 104 may be positioned such that the gap distance is different from the optimal gap distance and such that the suppression current is less than 1 mA. A suppression current of less than 8 mA may be desirable for preventing process reliability issues related to excessive buildup of deposits and arcing in extraction manipulator 104.

When extraction manipulator 104 is positioned at a gap distance that is different from the optimal gap distance, ion beam 106 may be defocused, thereby resulting in a wider ion beam 106. Specifically, the x-dimension of ion beam 106 exiting extraction manipulator 104 may be greater when extraction manipulator 104 is positioned at a gap distance that is different from the optimal gap distance than when extraction manipulator 104 is positioned at the optimal gap distance. As described below, a wider ion beam may be desirable for enabling lower dose rate ion implantation and thus reducing device damage.

In some examples, block 304 may further include positioning extraction manipulator 104 such that aperture 138 of suppression electrode 120 is misaligned with respect to exit aperture 126. For example, extraction manipulator 104 may be moved in a direction parallel to faceplate 136 to misalign aperture 138 with respect to exit aperture 126. Specifically, with reference to FIG. 2A, extraction manipulator 104 may be moved in a direction represented by arrow 206 to misalign aperture 138 with respect to exit aperture 126. Misaligning aperture 138 may be desirable to reduce the suppression current of suppression electrode 120. Further, in some cases, the uniformity and symmetry of the ion beam profile may be improved by misaligning aperture 138 with respect to exit aperture 126.

Although performing ion implantation with extraction manipulator 104 at the optimal gap distance may be desirable for reasons described above, positioning extraction manipulator 104 at a gap distance that is different from the optimal gap distance may have unexpected advantages or results. As described above, ion beam 106 may be wider when extraction manipulator 104 is positioned at a gap distance that is different from the optimal gap. A wider ion beam may spread the current of the ion beam over a larger area, which reduces the beam density. A lower beam density may enable ion implantation at sufficiently low dose rates to prevent damage to devices formed on work piece 116. Further, the suppression current of suppression electrode 120 and the uniformity of ion beam 106 may be sufficiently optimized by appropriately positioning extraction manipulator 104 and adjusting the parameters of the components downstream of extraction manipulator 104. For example, the uniformity of ion beam 106 may be sufficiently optimized using second set of electrodes 134 and multipole magnets 110 and 114 as described below.

At block 306 of process 300, a first potential may be applied to first set of electrodes 132. For example, the first potential may be applied to first set of electrodes 132 using a power supply coupled to first set of electrodes 132. In examples where first set of electrodes 132 is a single electrode with one or more channels for ion beam 106 to pass through, the first potential may be applied such that the single electrode is biased at the first potential. In examples where first set of electrodes 132 includes multiple electrodes, the first potential may be applied to each electrode such that the electrodes of first set of electrodes 132 may be biased at the same first potential. However, in other examples, different potentials may be applied to the electrodes of first set of electrodes 132. First potential may be applied such that ion beam 106 is attracted toward the electrode or electrodes of first set of electrodes 132, thereby causing ion beam 106 to widen. Specifically, the x-dimension of ion beam 106 may increase as ion beam 106 passes through first set of electrodes 132. In examples where ion beam 106 comprises positive ions, the first potential may be a negative potential relative to ground. Conversely, in examples where ion beam 106 comprises negative ions, the first potential may be a negative potential relative to ground. In some examples, the magnitude of the applied first potential may be 5-25 keV. More specifically, in some examples, the magnitude of the applied first potential may be 10-20 keV.

In this example, the y-dimension of ion beam 106 may be parallel to a plane that is aligned with the length of first set of electrodes 132 as ion beam 106 passes through first set of electrodes 132. In other examples, the y-dimension of ion beam 106 may be parallel to the length of first set of electrodes 132 as ion beam 106 passes through first set of electrodes 132. In some examples, ion beam 106 may pass through electrode assembly 112 that includes first set of electrodes 132. Ion beam 106 may be accelerated or decelerated as it passes through electrode assembly 112. Further, the shape, direction, divergence, and/or uniformity of ion beam 106 may be adjusted by electric fields generated by various other electrodes in electrode assembly 112. It should be recognized that in other examples, first set of electrodes 132 may be a discrete component or part of a different electrode assembly of ion implantation system 100.

At block 308 of process 300, a second potential may be applied to second set of electrodes 134. For example, second potential may be applied to second set of electrodes 134 using a power supply coupled to second set of electrodes 134. In examples where second set of electrodes 134 is a single electrode, the second potential may be applied such that the single electrode is biased at the second potential. In examples where second set of electrodes 134 includes at least two electrodes, the second potential may be applied to each electrode such that the electrodes of second set of electrodes 134 may be biased at the same second potential. However, in other examples, different potentials may be applied to the electrodes of second set of electrodes 134. Second potential may be applied such that ion beam 106 is attracted toward the electrode or electrodes of second set of electrodes 134 to "stretch" ion beam 106 and thus improve the uniformity of ion beam 106. In examples where ion beam 106 comprises positive ions, the applied second potential may be a negative potential relative to ground. Conversely, in examples where ion beam 106 comprises negative ions, the second potential may be a negative potential relative to ground. In some examples, the magnitude of the applied second potential may be 0.5-15 keV. More specifically, in some examples, the magnitude of the applied second potential may be 1-10 keV.

Figure 4:
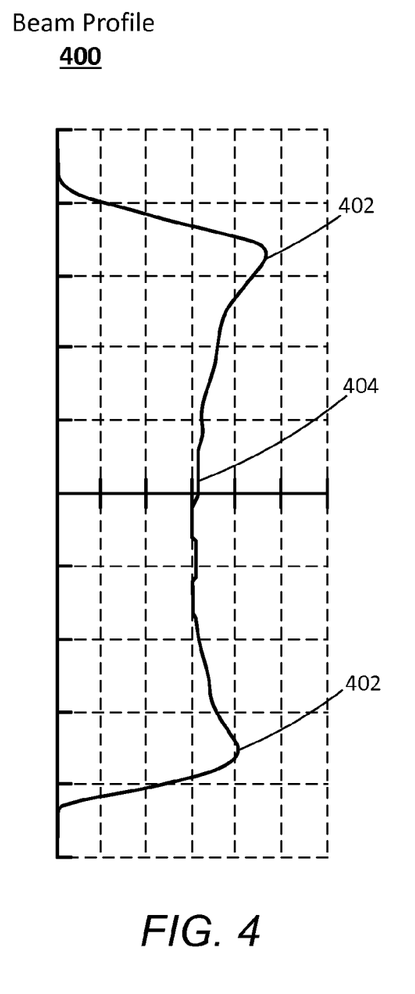
FIG. 4 illustrates a beam profile of an exemplary ion beam having an undesirable uniformity.
Figure 5:
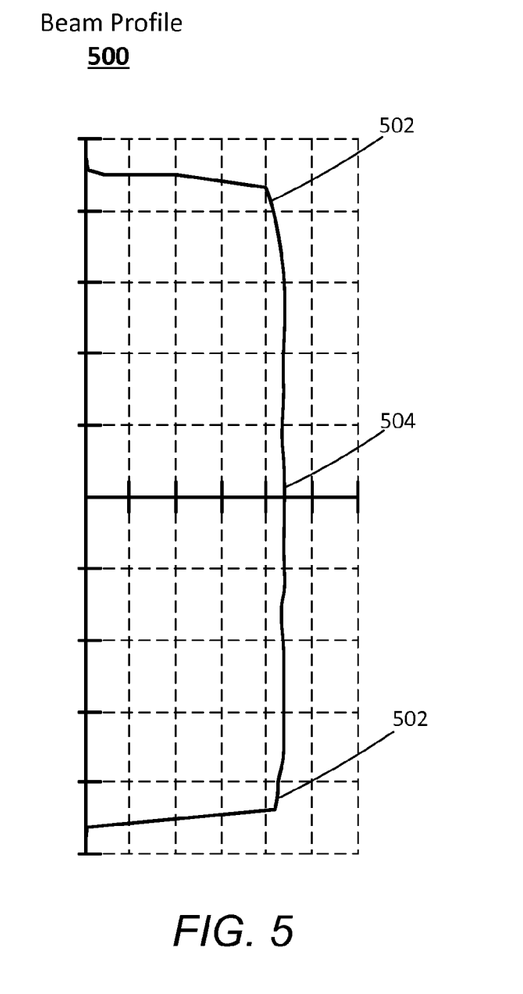
FIG. 5 illustrates a beam profile of an exemplary ion beam having a desirable uniformity.

In some examples, the uniformity of ion beam 106 may improve as ion beam 106 passes through second set of electrodes. For example, FIG. 4 illustrates beam profile 400 of ion beam 106 at work piece 116 in the y-dimension when the second potential is not applied to second set of electrodes 134 to improve the uniformity of ion beam 106. As shown in FIG. 4, the beam density at the edges 402 of ion beam 106 may be significantly greater (e.g., at least 25 percent) than the beam density at the center 404 of ion beam 106. In contrast, FIG. 5 illustrates beam profile 500 of ion beam 106 at work piece 116 in the y-dimension when second potential is applied to second set of electrodes 134 to improve the uniformity of ion beam 106. As shown in FIG. 5, the beam density at the edges 502 of ion beam 106 may be comparable to the beam density at the center 504 of ion beam 106. In some examples, the uniformity of ion beam 106 at work piece 116 in the y-dimension may be less than 2 percent.

In this example, the x-dimension of ion beam 106 may be parallel to a plane that is aligned with the length of second set of electrodes 134 as ion beam 106 passes through second set of electrodes 134. In other examples, the x-dimension of ion beam 106 may be parallel to the length of second set of electrodes 134 as ion beam 106 passes through second set of electrodes 134. In some examples, ion beam 106 may pass through electrode assembly 112 that includes second set of electrodes 134. It should be recognized that in other examples, second set of electrodes 134 may be a discrete assembly or may form part of a different assembly of ion implantation system 100.

At block 310 of process 300, work piece 116 may be positioned in ion beam 106 to implant ions into work piece 116. For example, work piece 116 may be positioned using work piece support structure 118 such that ion beam 106 impinges onto work piece 116, thereby causing ions to implant into work piece 116. In some examples, work piece support structure 118 may move work piece 116 relative to ion beam 106 to cause ion beam 106 to scan across work piece 116. Specifically, work piece support structure 118 may move work piece 116 in a direction parallel to the x-dimension of ion beam 106. The scan speed of work piece 116 may be controlled using work piece support structure 118 to fine-tune the dose rate. Further, work piece support structure 118 may rotate work piece 116 to enable ions to implant uniformly into work piece 116.

Work piece 116 may comprise any suitable substrate used in the manufacturing of semiconductor devices, solar panels, or flat-panel displays. In examples where work piece 116 comprises a semiconductor substrate (e.g., silicon, germanium, gallium arsenide, etc.), work piece 116 may include semiconductor devices at least partially formed thereon. Further, work piece 116 may include a top-most mask layer. The mask layer may comprise a photo-resist layer or a hard mask layer (e.g., silicon nitride, silicon oxide, silicon oxynitride, silicon carbide, carbon, etc.)

Figure 7:
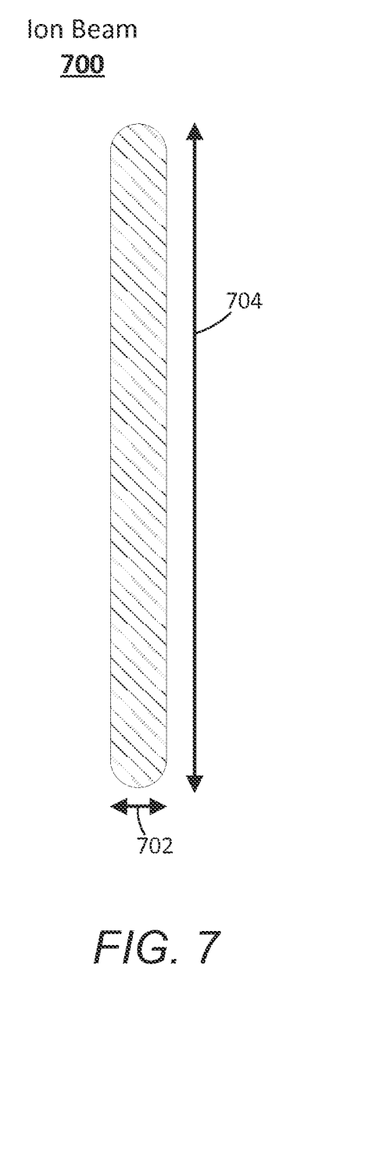
FIG. 7 illustrates a cross-sectional view of an exemplary conventional ion beam that is used in conventional ion implantation processes.

As described above, FIG. 6 illustrates a cross-sectional view of ion beam 106 at work piece 116 used in lower dose rate ion implantation processes (e.g., process 300 described herein). As shown, ion beam 106 at work piece 116 may include x-dimension 602 that is greater than that used in conventional ion implantation processes. For instance, in some examples, the x-dimension 602 of ion beam 106 at work piece 116 may be at least 80 mm. More specifically, in some examples, the x-dimension 602 of ion beam 106 at work piece 116 may be 90-120 mm. Further, y-dimension 604 of ion beam 106 at work piece 116 may be at least 300 mm. In contrast, FIG. 7 illustrates a cross-sectional view of conventional ion beam 700 at a work piece used in conventional ion implantation processes. Conventional ion beam 700 may be generated by positioning the extraction manipulator at the optimal gap distance from the exit aperture. As shown in FIG. 7, x-dimension 702 of conventional ion beam 700 may be significantly smaller than x-dimension 602 of ion beam 106. In some examples, x-dimension 702 of conventional ion beam 700 may be less than 70 mm. More specifically, in some examples, x-dimension 702 of conventional ion beam 700 may be 30-70 mm. Y-dimension 704 of ion beam 700 at work piece 116 may be at least 300 mm.

In some examples, process 300 can further include controlling the temperature of work piece 116 within a suitable temperature range to reduce device damage during ion implantation and, in some cases, promote self-annealing. For example, work piece support structure 118 may be used to control the temperature of work piece 116. Controlling the temperature of work piece 116 during process 300 may be desirable for reducing substrate surface damage, thereby improving process control and device performance. In some examples, the temperature of work piece 116 may be controlled to between −75 and −5 degrees Celsius, or in some cases between −50 and −5 degrees Celsius. These temperature ranges may be advantageous for increasing the amorphous layer thickness and crystalline damage level, which enables better re-crystallization after annealing. In examples where work piece 116 includes a photo-resist layer, the temperature of work piece 116 may be controlled to between 80 and 180 degrees Celsius to promote self-annealing while preventing damage to the photo-resist layer. Further, in examples where work piece 116 includes a hard mask layer, the temperature of work piece 116 may be controlled to between 180 and 500 degree Celsius to promote self-annealing.

Although blocks 302 through 310 of process 300 are shown in a particular order in FIG. 3, it should be appreciated that these blocks may be performed in any order and that some blocks can be performed simultaneously. For instance, in some examples, the first potential may be applied to first set of electrodes 132 at block 306 after positioning the extraction manipulator at a gap distance that is different from the optimal gap distance at block 304. However, in other examples, the first potential may be applied to first set of electrodes 132 at block 306 prior to positioning the extraction manipulator at a gap distance that is different from the optimal gap distance at block 304. In these examples, the x-dimension of ion beam 106 may be increased using first set of electrodes 132 before adjusting the gap distance between extraction manipulator 104 and exit aperture 126 to further increase the x-dimension of ion beam 106.

Further, it should be appreciated that in some cases, one or more blocks of process 300 can be optional and additional blocks can be performed. For instance, in some examples, process 300 may further include applying a suitable magnetic field to ion beam 106 to adjust the shape, angle, and/or uniformity of ion beam 106. For example, multipole magnets 110, 114 may be used to apply a magnetic field to ion beam 106. In some examples, ion beam 106 may pass through first set of electrodes 132 prior to entering the multipole magnets 110 or 114. In other examples, ion beam 106 may pass through first set of electrodes 132 after exiting the multipole magnets 110 or 114. In some examples, the applied magnetic field may be a non-uniform magnetic field. In these examples, electrical energy to the individual coils of multipole magnets 110, 114 may be adjusted to achieve a magnetic field that is suitable for improving the uniformity and/or symmetry of ion beam 106 in the y-dimension.

In conventional ion implantation processes, multipole magnets 110, 114 may not be effective at widening the narrow ion beam generated because the magnetic field at the middle of multipole magnets 110, 114 may be approximately zero. However, because ion beam 106 used in process 300 is widened by extraction manipulator 104 at block 304, multipole magnets 110, 114 may be more effective at further increasing the x-dimension of ion beam 106 by applying a suitable magnetic field to ion beam 106. Therefore, in some examples, process 300 may include applying a suitable magnetic field to ion beam 106 to further increase the x-dimension of ion beam 106.

Further, in some examples, a suitable magnetic field may be applied to ion beam 106 to improve the uniformity of ion beam 106 in the y-dimension. In particular, the magnetic field applied to ion beam 106 may be suitable to achieve a uniformity of ion beam 106 at work piece 116 that is less than 2 percent.

While specific components, configurations, features, and functions are provided above, it will be appreciated by one of ordinary skill in the art that other variations may be used. Additionally, although a feature may appear to be described in connection with a particular embodiment, one skilled in the art would recognize that various features of the described embodiments may be combined. Moreover, aspects described in connection with an embodiment may stand alone.

Although embodiments have been fully described with reference to the accompanying drawings, it should be noted that various changes and modifications will be apparent to those skilled in the art. Such changes and modifications are to be understood as being included within the scope of the various embodiments as defined by the appended claims.

What is claimed is:

1. A method for implanting ions into a work piece at lower dose rates, the method comprising:
   generating an ion beam using an ion source operating with a set of ion source conditions and an extraction manipulator, wherein the ion beam includes an x-dimension that is perpendicular to a y-dimension of the ion beam, and wherein the x-dimension and the y-dimension are perpendicular to a direction of travel of the ion beam;
   while the ion source is operating with the set of ion source conditions:
      positioning the extraction manipulator at an optimal gap distance from an exit aperture of the ion source, wherein a current of the ion beam exiting the extraction manipulator is maximized for the set of ion source conditions when the extraction manipulator is positioned at the optimal gap distance from the exit aperture;
      after positioning the extraction manipulator at the optimal gap distance, positioning the extraction manipulator at a second gap distance from the exit aperture of the ion source, wherein the second gap distance differs from the optimal gap distance by at least 10 percent;
      applying a first potential to a first set of electrodes, wherein the x-dimension of the ion beam is increased as the ion beam passes through the first set of electrodes; and
      while the extraction manipulator is positioned at the second gap distance, positioning the work piece in the ion beam to implant ions into the work piece.

2. The method of claim 1, wherein the extraction manipulator includes a suppression electrode, and wherein a suppression current of the suppression electrode is less than 8 milliamperes (mA) when the extraction manipulator is positioned at the second gap distance from the exit aperture.

3. The method of claim 1, wherein the extraction manipulator includes a suppression electrode, and wherein a suppression current of the suppression electrode is minimized when the extraction manipulator is positioned at the optimal gap distance from the exit aperture.

4. The method of claim 1, wherein the x-dimension of the ion beam exiting the extraction manipulator is greater when the extraction manipulator is positioned at the second gap distance from the exit aperture than when the extraction manipulator is positioned at the optimal gap distance from the exit aperture.

5. The method of claim 1, wherein the y-dimension of the ion beam is parallel to a plane that is aligned with a length of the first set of electrodes as the ion beam passes through the first set of electrodes.

6. The method of claim 1, wherein the second gap distance is greater than the optimal gap distance.

7. The method of claim 1, wherein the second gap distance is less than the optimal gap distance.

8. The method of claim 1, further comprising:
applying a magnetic field to the ion beam using multipole magnets, wherein the magnetic field improves a uniformity and a symmetry of the ion beam.

9. The method of claim 8, wherein the ion beam passes through the first set of electrodes prior to entering the multipole magnets.

10. The method of claim 8, wherein the ion beam passes through the first set of electrodes after exiting the multipole magnets.

11. The method of claim 8, wherein the magnetic field increases the x-dimension of the ion beam.

12. The method of claim 1, further comprising:
applying a second potential to a second set of electrodes, wherein a uniformity of the ion beam in the y-dimension improves as the ion beam passes through the second set of electrodes.

13. The method of claim 12, wherein a uniformity of the ion beam in the y-dimension at the work piece is less than 2 percent.

14. The method of claim 12, wherein the ion beam passes through an electrode assembly that is configured to accelerate or decelerate the ion beam, and wherein the electrode assembly includes the second set of electrodes.

15. The method of claim 12, wherein a plane that is aligned with a length of the second set of electrodes is parallel to the x-dimension of the ion beam as the ion beam passes through the second set of electrodes.

16. The method of claim 1, wherein the ion beam passes through an electrode assembly that is configured to accelerate or decelerate the ion beam, and wherein the electrode assembly includes the first set of electrodes.

17. The method of claim 1, wherein applying the first potential to the first set of electrodes is performed prior to positioning the extraction manipulator at the second gap distance.

18. The method of claim 1, wherein applying the first potential to the first set of electrodes is performed after positioning the extraction manipulator at the second gap distance.

19. The method of claim 1, wherein the ion beam impinges on the work piece, and wherein the x-dimension of the ion beam at the work piece is at least 80 millimeters and the y-dimension of the ion beam at the work piece is at least 300 millimeters.

20. The method of claim 1, further comprising:
translating the work piece in a direction parallel to the x-dimension of the ion beam to scan the ion beam across the work piece.

21. The method of claim 1, wherein the work piece is supported by a work piece support structure, and further comprising:
controlling a temperature of the work piece to between −50 and −5 degrees Celsius using the work piece support structure.

22. The method of claim 1, wherein the work piece is supported by a work piece support structure, and further comprising:
controlling a temperature of the work piece to between 80 and 180 degrees Celsius using the work piece support structure, wherein the work piece includes a photoresist layer.

23. The method of claim 1, wherein the work piece is supported by a work piece support structure, and further comprising:
controlling a temperature of the work piece to between 180 and 500 degrees Celsius using the work piece support structure, wherein the work piece includes a hard mask layer.

24. A non-transitory computer-readable storage medium containing computer executable instructions for implanting ions into a work piece at lower dose rates, the computer executable instructions comprising instructions for:
generating an ion beam using an ion source operating with a set of ion source conditions and an extraction manipulator, wherein the ion beam includes an x-dimension that is perpendicular to a y-dimension of the ion beam, and wherein the x-dimension and the y-dimension are perpendicular to a direction of travel of the ion beam;
while the ion source is operating with the set of ion source conditions:
positioning the extraction manipulator at an optimal gap distance from an exit aperture of the ion source, wherein a current of the ion beam exiting the extraction manipulator is maximized for the set of ion source conditions when the extraction manipulator is positioned at the optimal gap distance from the exit aperture;
after positioning the extraction manipulator at the optimal gap distance, positioning the extraction manipulator at a second gap distance from the exit aperture of the ion source, wherein the second gap distance differs from the optimal gap distance by at least 10 percent;
applying a first potential to a first set of electrodes, wherein the x-dimension of the ion beam is increased as the ion beam passes through the first set of electrodes; and
while the extraction manipulator is positioned at the second gap distance, positioning the work piece in the ion beam to implant ions into the work piece.

25. The non-transitory computer-readable storage medium of claim 24, wherein the extraction manipulator includes a suppression electrode, and wherein a suppression current of the suppression electrode is less than 8 milliamperes (mA) when the extraction manipulator is positioned at the second gap distance from the exit aperture.

26. The non-transitory computer-readable storage medium of claim 24, wherein the extraction manipulator includes a suppression electrode, and wherein a suppression current of the suppression electrode is minimized when the extraction manipulator is positioned at the optimal gap distance from the exit aperture.

27. The non-transitory computer-readable storage medium of claim 24, wherein the x-dimension of the ion beam exiting the extraction manipulator is greater when the extraction manipulator is positioned at the second gap distance from the exit aperture than when the extraction manipulator is positioned at the optimal gap distance from the exit aperture.

28. The non-transitory computer-readable storage medium of claim 24, further comprising:
applying a magnetic field to the ion beam using multipole magnets, wherein the magnetic field improves a uniformity and a symmetry of the ion beam.

29. The non-transitory computer-readable storage medium of claim 28, wherein the magnetic field increases the x-dimension of the ion beam.

30. The non-transitory computer-readable storage medium of claim 24, wherein applying the first potential to the first set of electrodes is performed prior to positioning the extraction manipulator at the second gap distance.

31. The non-transitory computer-readable storage medium of claim 24, wherein applying the first potential to the first set of electrodes is performed after positioning the extraction manipulator at the second gap distance.

32. The non-transitory computer-readable storage medium of claim 24, further comprising:
  applying a second potential to a second set of electrodes, wherein a uniformity of the ion beam in the y-dimension improves as the ion beam passes through the second set of electrodes.

33. The non-transitory computer-readable storage medium of claim 32, wherein a plane that is aligned with a length of the second set of electrodes is parallel to the x-dimension of the ion beam as the ion beam passes through the second set of electrodes.

34. The non-transitory computer-readable storage medium of claim 24, wherein the ion beam impinges on the work piece, and wherein the x-dimension of the ion beam at the work piece is at least 80 millimeters and the y-dimension of the ion beam at the work piece is at least 300 millimeters.

35. The non-transitory computer-readable storage medium of claim 24, wherein the work piece is supported by a work piece support structure, and further comprising:
  controlling a temperature of the work piece to between −50 and −5 degrees Celsius using the work piece support structure.

36. The non-transitory computer-readable storage medium of claim 24, wherein the work piece is supported by a work piece support structure, and further comprising:
  controlling a temperature of the work piece to between 80 and 180 degrees Celsius using the work piece support structure, wherein the work piece includes a photoresist layer.

37. The non-transitory computer-readable storage medium of claim 24, wherein the work piece is supported by a work piece support structure, and further comprising:
  controlling a temperature of the work piece to between 180 and 500 degrees Celsius using the work piece support structure, wherein the work piece includes a hard mask layer.

* * * * *